(12) United States Patent  
Kölbli et al.

(10) Patent No.: US 7,723,997 B2
(45) Date of Patent: May 25, 2010

(54) METHOD AND ARRANGEMENT FOR THE DETECTION OF A COIL

(75) Inventors: Bertram Kölbli, Frankfurt am Main (DE); Bernhard Bug, Eichenzell (DE); Martin Leonhardt, Aichhalden (DE); Alexander Zinell, Villingen-Schwenninigen (DE)

(73) Assignee: Junghans Microtec GmbH (DE)

( * ) Notice: Subject to any disclaimer, the term of this patent is extended or adjusted under 35 U.S.C. 154(b) by 165 days.

(21) Appl. No.: 11/855,810

(22) Filed: Sep. 14, 2007

(65) Prior Publication Data

US 2008/0074124 A1 Mar. 27, 2008

(30) Foreign Application Priority Data

Sep. 22, 2006 (DE) .................... 10 2006 045 319

(51) Int. Cl.
*G01R 31/06* (2006.01)
*G01R 31/08* (2006.01)

(52) U.S. Cl. .................... 324/546; 324/655; 324/649

(58) Field of Classification Search ................. 324/546
See application file for complete search history.

(56) References Cited

U.S. PATENT DOCUMENTS

| | | | | |
|---|---|---|---|---|
| 2,741,738 A * | 4/1956 | Reid | .................... | 324/545 |
| 4,223,267 A * | 9/1980 | Sartorius et al. | .................... | 368/118 |
| 4,746,869 A * | 5/1988 | Schrag et al. | .................... | 324/546 |
| 5,345,181 A * | 9/1994 | Mantani et al. | .................... | 324/546 |
| 6,052,005 A * | 4/2000 | Braun | .................... | 327/143 |
| 6,426,634 B1 * | 7/2002 | Clunn et al. | .................... | 324/536 |
| 6,640,956 B1 * | 11/2003 | Zwieg et al. | .................... | 194/328 |
| 2001/0038290 A1 * | 11/2001 | Coffeen | .................... | 324/547 |

FOREIGN PATENT DOCUMENTS

| | | |
|---|---|---|
| EP | 0575061 | 7/1999 |
| GB | 1454598 | 11/1976 |
| GB | 2062985 | 5/1981 |
| JP | 61 004975 A | 1/1986 |
| JP | 04 101509 A | 4/1992 |
| JP | 2002 288811 A | 10/2002 |
| JP | 2002 324710 A | 11/2002 |

OTHER PUBLICATIONS

Speiser, "Impulsschaltungen" ["Pulse circuits"]. Springer Verlag 1963, p. 133, figure 150b.
English translation of Japanese Patent Abstract No. JP 61 004975 A.
Japanese Patent Document JP 61 004975 A.
English translation of Japanese Patent Abstract No. JP 04 101509 A.

(Continued)

*Primary Examiner*—Timothy J Dole
*Assistant Examiner*—John Zhu
(74) *Attorney, Agent, or Firm*—McAndrews, Held & Malloy, Ltd.

(57) ABSTRACT

A method and an arrangement for the detection of a coil in an electronic circuit, which is operated with a direct voltage lying within a prescribed voltage range, and in which the coil together with a condenser forms an electrical oscillating circuit.

35 Claims, 4 Drawing Sheets

OTHER PUBLICATIONS

Japanese Patent Document JP 04 101509 A.
English translation of Japanese Patent Abstract No. JP 2002 324710 A.
Japanese Patent Document JP 2002 324710 A.
Computer generated English translation of Japanese Patent Document JP 2002 324710 A.
English translation of Japanese Patent Abstract No. JP 2002 288811 A.
Japanese Patent Document JP 2002 288811 A.
Computer generated English translation of Japanese Patent Document JP 2002 288811 A.

\* cited by examiner

METHOD AND ARRANGEMENT FOR THE DETECTION OF A COIL

RELATED APPLICATIONS

This application claims priority under 35 U.S.C. §119(a) to German patent application No. 10 2006 045 319.0, filed Sep. 22, 2006, the complete subject matter of which is incorporated herein by reference in its entirety.

BACKGROUND OF THE INVENTION

The present technology, in general, concerns a method and an arrangement for the detection of a coil in an electronic circuit, which is operated with a direct voltage lying within a prescribed voltage range, and in which the coil, together with a condenser, forms an electrical oscillating circuit.

Circuits of this kind are in widespread use. In particular, they are operated in a voltage range between ground and a usually positive supply voltage, which is made available from an external voltage source or by means of a condenser present within the electronic circuit with appropriate voltage stabilisation. In the context of this document a coil is understood to be an electrical component with inductive properties and a condenser is understood to be an electrical component with capacitive properties, which together are able to form an electrical oscillating circuit.

BRIEF SUMMARY OF THE INVENTION

The subject of the present technology is therefore a method and an arrangement with which the presence of this coil in the electrical circuit can be ascertained. A typical use of the present technology is therefore a circuit in which the coil represents an inductive interface to an external alternating current voltage supply and/or for data transfer. Circuits of this kind are, for example, used in order to start a prescribed program sequence after the removal or short-circuiting of the coil as a triggering event. It is therefore important to be able reliably to ascertain the removal of the coil within the electronic circuit. In the event of a complete removal of the coil the coil terminals are open circuit, so that a high ohmic resistance can be ascertained between the two coil terminals. In contrast, in the event of a short-circuit of the coil terminals, however, no resistance can be ascertained. Depending on the place in which the circuit is installed it can also happen that after the removal of the coil an ohmic resistance is ascertained that corresponds to the pure ohmic resistance of the coil, if the coil terminals are dirty, for example, or come into contact with a weakly conducting medium.

Therefore it is not possible to come to a reliable conclusion concerning the presence or absence of a coil in the circuit by means of a simple measurement of the ohmic resistance between the coil terminals in the electrical circuit.

At least one aspect of the present technology is to be able to reliably detect a coil in an electrical circuit. This aspect is achieved with the features, for example, of Claims 1 and 7. In particular, in the method according to the present technology provision is made that the electrical circuit is excited with a pulse, which during the oscillation temporarily generates a voltage value lying outside the prescribed voltage range on a first coil terminal that can be tapped on the coil. This voltage value, which can only be achieved within the electronic circuit if an electronic component with inductive properties is connected to the first coil terminal, therefore reliably indicates the presence of the coil. If on the other hand this voltage value is not ascertained, the conclusion can be drawn that no coil is connected to the first coil terminal in the electronic circuit, or that it has been removed.

The removal of a coil can then be ascertained particularly reliably, if this voltage value lying outside the prescribed voltage range is determined by sampling the flank of the tapped voltage signal. In particular, for this purpose a voltage signal can be generated from the voltage directly tapped at the first coil terminal, which only has a negative or positive flank in the voltage characteristic indicating the absence of the coil, if a voltage is present on the first coil terminal that lies outside the prescribed voltage range of the electronic circuit.

Since the occurrence of voltages lying outside the operating voltage range can often cause damage to electronic components in the electronic circuits, it is sensible for the protection of these components to protect the voltage tapped at the first coil terminal, and/or the voltage derived therefrom, via a diode. For this purpose, the diode can be preferably connected to a ground at the input of the voltage detector. A Schottky diode is particularly suitable for this purpose; this has a particularly rapid switching characteristic and possesses a smaller forward voltage than parasitic diodes of a silicon circuit connected. Hence, it is in a conducting state earlier and so protects the silicon circuit.

In this case, it is possible to register the voltage tapped at the first coil terminal at an input port of a microprocessor. Since only a limited voltage range, as a rule between ground and a maximum, usually positive supply voltage, can be applied to a microprocessor, that is to say, to its input ports, an input port of this kind can be reliably protected against the occurrence of high voltage of one polarity by the previously described diode.

According to the present technology, it is particularly advantageous if the tapping of the voltage at the first coil terminal takes place by means of electrical components that are part of a rectifier circuit. In this case, the coil can provide the inductive connection of the electronic circuit to an upstream circuit, for energy supply, for example, and/or programming. At the same time, the action of the rectifier thereby provides a protective function for the input port of the microprocessor, which in particular with the previously described diode limits the possible input voltages at the port connection to a permissible voltage range.

Part of such a rectifier circuit can be an NPN transistor, via which the voltage present at the first coil terminal is tapped. For this purpose the NPN transistor is preferably operated inversely and in a grounded-base circuit. In this manner, the input port lying behind the NPN transistor can be protected from high voltages lying above the maximum supply voltages. Therefore, the use of an NPN transistor is also sensible if the latter is not part of a rectifier circuit.

According to a particularly advantageous embodiment of the method according to the present technology, the voltage tapped at the first coil terminal and, for example, present at the input port of the microprocessor, can also be drawn on for determination of the frequency of an alternating voltage externally applied onto the coil, for example if the quartz stabilisation of the electronic circuit is not sufficiently accurate. In this way, the signal can be used for the calibration of the frequencies used and even for the detection of modulations in the information transfer, for example, in the context of a programming function.

In particular, in an arrangement according to the present technology for the detection of a coil in an electronic circuit with a coil and a condenser that together form an electronic oscillating circuit, operated with a direct voltage within a prescribed voltage range, for the solution of the task according to the present technology provision is made that a first coil terminal of the coil is connected to a pulse generator for the generation of a pulse, and has a voltage detector for the detection of a voltage value lying outside the voltage range of the direct voltage. This arrangement can be used particularly advantageously for the execution of the previously described method.

According to the present technology it is particularly advantageous if the voltage detector is connected via an NPN transistor to the first coil terminal, wherein the NPN transistor, on account of the higher electrical strength of the collector-base junction compared with the emitter-base junction, is preferably operated in inverse mode.

Furthermore, a Schottky diode can be connected to a ground between the NPN transistor, that is to say, its emitter terminal, and the voltage detector. By means of this arrangement voltages present below the prescribed voltage range, within which the electronic circuit is operated, can be isolated such that the tapped voltage signal can be connected to the input port of a microprocessor that is in particular driven with the supply voltage.

The port inputs and/or outputs of the microprocessor are then, in particular, the voltage detector and/or the pulse generator.

According to a particularly preferred form of embodiment of the present technology, a rectifier is connected downstream of the electrical oscillating circuit that contains the coil. This is equivalent of the coil being able to be an interface of the electronic circuit to an upstream circuit, which in particular generates an alternating voltage for energy supply to and/or programming of the electronic circuit.

Thereby, the NPN transistor can be part of the rectifier and in particular can undertake the task of one of the diodes of a rectifier bridge circuit of four diodes.

The method according to the present technology, as well as the arrangement that can in particular be introduced for execution of the method, are suitable for detecting particularly reliably the removal of a coil from an electronic circuit. Therefore, they can be particularly advantageously used if the removal of the coil is drawn on as a triggering event for a procedure that takes place subsequently, for example, the execution of a program inputted within the electronic circuit.

Further advantages, features and possible applications of the present technology ensue from the following description of an example of embodiment and the drawing. Thereby all described and/or figuratively represented features form, separately or in any combination, the subject of the present technology, also independently of their summary in the claims or their back references.

DETAILED DESCRIPTION OF THE INVENTION

Figure 1:
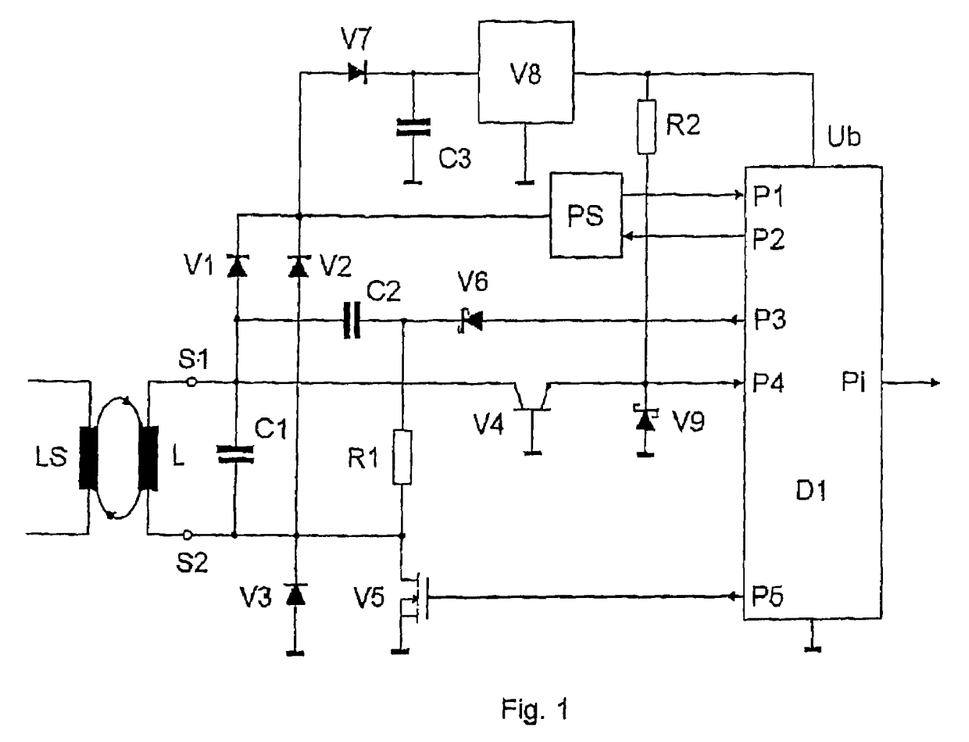
FIG. 1 shows an electronic circuit with coil detection according to the present technology.

FIG. 1 shows an electronic circuit with a microprocessor D1. The complete electronic circuit is supplied with energy via an interactive interface, which has a transmitter coil LS and a receiver coil L. Furthermore the interface serves for programming of the microprocessor D1. For this purpose, the receiver coil L receives an alternating field from an external commutating coil LS, represented in FIG. 1 by arrows between the coil LS and the coil L. The energy thereby transferred is rectified in a manner described in more detail in what follows, and stored in a condenser C3. A voltage controller V8 downstream of the condenser C3 then supplies the complete electronic circuit for a certain time with a stabilised output voltage Ub on the basis of the energy stored in the condenser C3.

By modulation of the carrier signal of the magnetic alternating field between the coils LS, L data can also be transferred to the electronic circuit. The data transfer can in principle take place in both directions and in FIG. 1 is schematically indicated by the programming interface PS, which forwards the programming information contained in the modulated carrier signal to the input port P1 of the microprocessor D1. The programming interface PS receives any feedback signals from the microprocessor D1 via the output port P2. Programming interfaces PS of this kind are of known art and are therefore not elucidated in what follows.

After the programming of the microprocessor D1 via the inductive interface with the coils LS, L the microprocessor D1 after the removal of the receiver coil L is designed to execute a program, corresponding to the programmed-in parameters, which triggers a reaction at an output port Pi of the microprocessor D1 as a function of the programmed parameters. The removal of the coil L after the programming at the first and second coil terminals S1 and S2 is therefore designed to be used as a start signal for the execution of the program inputted into the microprocessor D1.

In order to be able to achieve the detection of the missing coil L with a high reliability, various galvanic conducting states at the coil terminals S1 and S2 must be detected after the removal of the coil L. The removal of the coil can for example take place as a rupturing of the coil in the event of a detonation of munitions, or similar, so that the exact state in the region of the coil terminals S1 and S2 is not known exactly. In particular, after the rupturing of the coil the coil terminals S1 and S2 can not only have a high ohmic resistance, but can also be short-circuited, or have an ohmic resistance whose value lies near that of the ohmic resistance of the coil L itself.

Therefore, the solution according to the present technology for coil detection is based on the detection of inductive properties of the coil L, which not only measures the ohmic resistance of the coil to check for its presence, but can draw conclusions as to whether the inductance of the coil L is present or not.

For this purpose a positive voltage pulse is outputted from the microprocessor D1 at its output port P3 via a Schottky diode V6, which pulse excites the sub-circuit formed by the two condensers C1 and C2 and the coil L such that the oscillatory system of the electrical circuit formed by the coil L and the condenser C1 also generates voltages that are negative relative to the ground potential, and otherwise do not occur in the electronic circuit supplied with the positive output voltage, i.e. supply voltage Ub.

The sub-circuit formed by the condensers C1 and C2 and the coil L is in principle already of known art (cf. Speiser, "Impulsschaltungen" ["Pulse circuits"], Springer Verlag 1963, page 133, FIG. 150*b*), wherein in the circuits of known art the voltage, bipolar relative to ground, is then rectified by means of a diode such that only the negative pulse components are outputted. A circuit of this kind cannot be used directly for the detection of the presence of the coil under the constraint of a limited operating voltage range.

If the evaluation of the voltage tapped at the coil terminal S1 is designed to take place via an input port P4 of the microprocessor D1, which is particularly advantageous from the point of view of practical implementation of the electronic circuit, it is particularly necessary to protect the port. Since the microprocessor is a digital component, it can only process or output voltages at its input or output ports that lie between ground and its operating voltage Ub, as a rule a positive voltage. Negative voltages can therefore not be applied at its input ports, since they could destroy the microprocessor. For exactly the same reason, however, high positive voltages that lie above the operating voltage Ub must also be avoided at the input ports, In the implementation of the detection circuit according to the present technology with a microprocessor D1 protective devices are therefore necessary for the input and/or output ports P3 and P4 of the microprocessor D1, which connect the microprocessor D1 with the coil terminals S1 and S2 for the necessary measurements. During the energy supply and programming procedures alternating voltages can occur at these coil terminals S1 and S2, which in magnitude clearly lie above the positive operating voltage Ub, or alternatively lie in the negative range. The input ports and/or outputs P3 and P4 of the microprocessor D1 must therefore on the one hand be protected against the high alternating voltages of the programming and energy supply procedures, and on the other hand any negative measured voltage that occurs at the coil terminal S1 and provides evidence of the presence of the coil L, is to be changed in polarity or limited such that the input port P4 can also detect the occurrence of negative voltages.

According to the present technology, this is to be implemented simply and with preferably few components. The protective function for the microprocessor D1 is essentially implemented by means of an NPN transistor, which is operated inversely and in a grounded-base circuit. In inverse operation, the transistor V4 tolerates positive voltages on its collector that is connected with the coil terminal S1, such as occur in the programming and energy supply phase, without these voltages being passed through to the input port P4. In contrast, negative voltages at the coil terminal S1 make the collector-base diode of the NPN transistor V4 conducting. In this case, the transistor V4 therefore acts as a functional partner of the diode V2, with positive voltages on the coil terminal S2 and negative voltages on the coil terminal S1. On the basis of this function, the collector-base diode of the transistor V4 together with the diodes V1 to V3 therefore forms a bridge rectifier of known art for alternating voltages during the programming phase, with the aid of which the energy supply and programming phases of the microprocessor D1 can be managed.

If the NPN transistor V4 were to be used in a grounded-base circuit that was not inversely operated, the maximum possible positive voltage at the coil terminal S1 would lie at approximately 6 volts, since otherwise the emitter-base junction of the transistor V4 would break down. In contrast, as a result of the use of the collector-base junction as a control diode of the inverse grounded-base circuit the electric strength of this input rises to the maximum collector voltage of the transistor V4.

In the inverse circuit, the current amplification of the transistor V4 is indeed significantly less, but with a conducting collector-base diode it is in each case sufficient to bring the emitter of the transistor V4, connected with the input port P4 of the microprocessor D1, from the positive operating voltage Ub to a negative potential of a diode voltage, for example of $U_{P4}=-0.7$ volts. In order that any parasitic input diode present at the input port P4 of the microprocessor D1 cannot become conducting as a result of this negative voltage, a Schottky diode V9 connected to ground is inserted between the emitter of the transistor V4 and the input port P4; this ensures that the voltage present at the input port P4 is greater than $U_{P4}=-0.4$ volts, i.e. that it has a lower limit. The microprocessor D1 can cope with this negative voltage range, in particular for a short time.

In this manner, it is possible according to the present technology to excite the electrical oscillating circuit with a pulse such that during the oscillation a voltage value is temporarily generated on the coil that lies outside the prescribed voltage range, namely a negative voltage value. This voltage value can be ascertained directly at the input port P4 of the microprocessor D1. This advantageous circuit is achieved with few additional electronic components, because the NPN transistor V4 for the tapping of the negative voltage at the coil terminal S1 is at the same time part of a bridge rectifier during the programming operation of the electronic circuit.

For the elucidation of the operation according to the present technology, typical voltage characteristics are elucidated in what follows in more detail with the aid of FIGS. 2 to 6.

Figure 2:
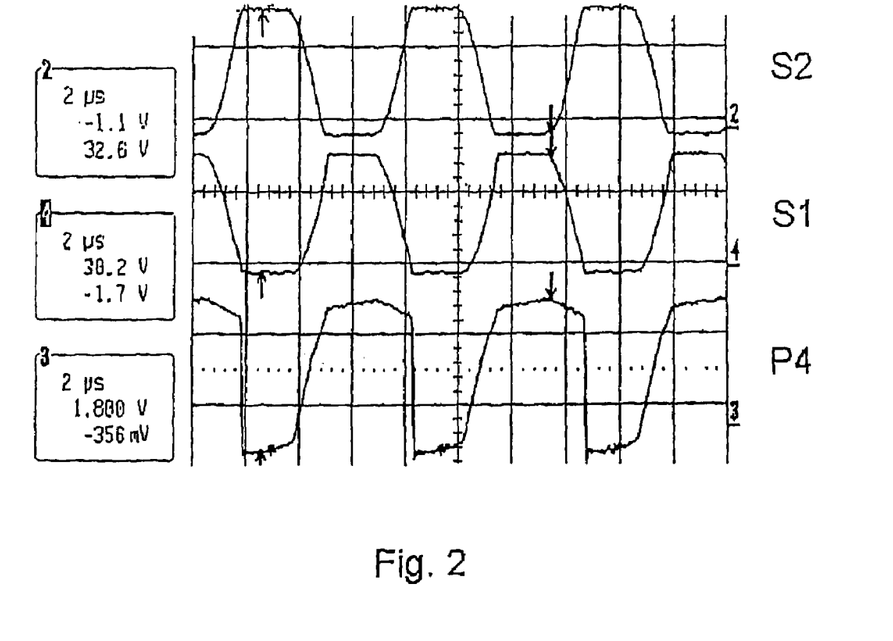
FIG. 2 shows examples of voltage characteristics at the coil terminals S1 and S2 as well as at the emitter output of the NPN transistor V4 from FIG. 1.

FIG. 2 shows the voltage characteristics during the programming phase at the coil terminals S1 and S2 and also the voltage tapped at the coil terminal S1 that via the emitter output of the transistor V4 is present at the input port P4 of the microprocessor D1.

As is expected during the programming phase in which an alternating voltage is applied to the coil L, the characteristic of this alternating voltage appears at the coil terminals S1 and S2, wherein the voltage range extends approximately from −2 V up to +30 V. The high voltages at the coil terminal S1 are lowered by the NPN transistor V4 to an operating voltage of 1.8 V, The negative voltages, which are passed through the NPN transistor, are limited by the Schottky diode V9 to a small negative voltage of the order of −300 mV. Therefore, the voltages tapped at the coil terminal S1 can also be applied to the input port P4 during the programming phase.

The frequency of the alternating voltage represented in FIG. 2, which is generated by an external programming unit, is quartz-stabilised as a rule. If for technical reasons (starting characteristics, mechanical robustness, etc.) the cycle time of the electronic microprocessor circuit cannot be quartz-stabilised, a calibration of the possibly inexact oscillator of the microprocessor circuit could be managed to a quartz-accurate carrier frequency, for example, via the input port P4 of the microprocessor D1, in order to implement an exact time function, for example.

Also a modulation carrier signal could be detected directly via the input port P4, instead of via the separate programming interface PS, in order to decode the programming information. In this manner, the electronic circuit can overall be further simplified.

When the programming phase is complete the detection phase begins for the detection of a removal of the coil L, as a result of a coil rupture, for example. For this purpose the microprocessor D1, firstly with a positive voltage at the output port P5, switches a MOSFET transistor V5 permanently into the conducting state, in order to fix the coil terminal S2 at ground potential. During the programming phase, the MOSFET transistor V5 was blocked by a 0-signal in order to enable the bridge rectification of the carrier. The maximum permissible drain voltage of the MOSFET transistor V5 must be higher than the maximum voltage occurring at the coil terminal S2.

Figure 3:
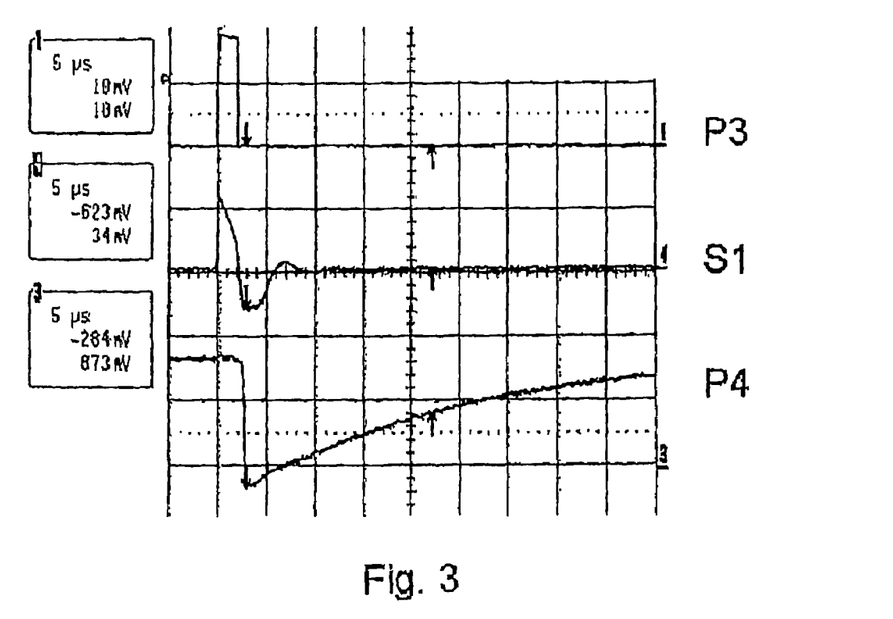
FIG. 3 shows the voltage signal tapped at the coil terminal S1 in the presence of a coil.

The microprocessor D1 next outputs at the output port P3 periodic individual pulses, each of a few microseconds duration, as can be detected in the first trace of FIG. 3. These are forwarded via the Schottky diode V6 and a resistance R1 to the circuit with the condensers C2, C1 and the coil L, in order to generate negative voltages corresponding exactly to the electrical oscillation at the coil terminal S1, if the coil L is connected to the coil terminals S1 and S2, because in these circumstances the exciting energy oscillates backwards and forwards between the energy stores of the coil L and condenser C1.

The Schottky diode V6 thereby protects the port P3 of the microprocessor D1 in the programming phase against high positive voltages and generates only a slight voltage drop, when the excitation pulses are outputted in the detection phase.

As can be detected in the second trace of FIG. 3, the circuit formed by the condensers C1, C2 and the coil L, as caused by the excitation pulses of the output port P3 corresponding to the signal tapped at the coil terminal S1, reacts with a damped, bipolar voltage pulse. As soon as the voltage tapped at the coil terminal S1 becomes negative, the NPN transistor V4 becomes conducting and its emitter voltage, forwarded to the input port P4 of the microprocessor D1, translates from a positive voltage derived from the operating voltage Ub to the negative clamping voltage of the Schottky diode V9. The voltage present at the port P4 can be extracted from the bottom trace of FIG. 3. This negative flank of the signal present at the input port P4, detectable in FIG. 3, is detected by the microprocessor D1 as an intact connected coil, and could for example also be used for the purpose of moving the microprocessor D1 into a current-saving sleep mode, out of which it is woken after a fixed time by an internal timer interrupt for the output of a new excitation pulse. This procedure can be repeated until negative flanks no longer occur on the voltage signal present at the input port P4 in reaction to an excitation pulse.

The absence of the negative flank of the signal at the input port P4 then defines the point in time of the removal of the coil L, and can thus be used as a start signal for an application program that has been programmed in the microprocessor D1.

Figure 4:
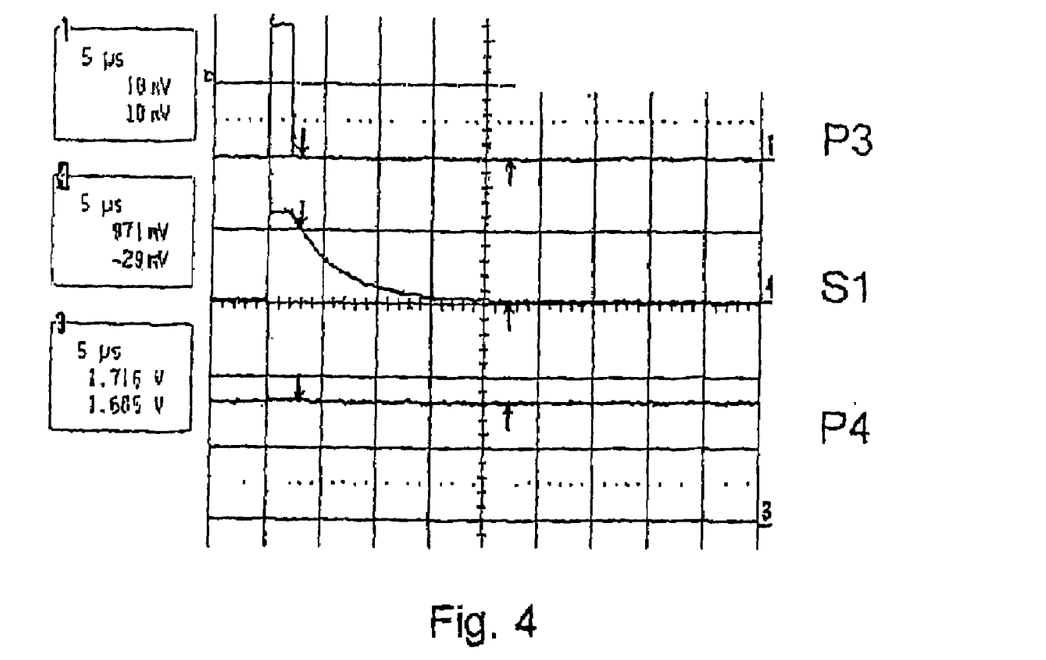
FIG. 4 shows the voltage signal tapped at the coil terminal S1 after a high ohmic separation of the coil.
Figure 5:
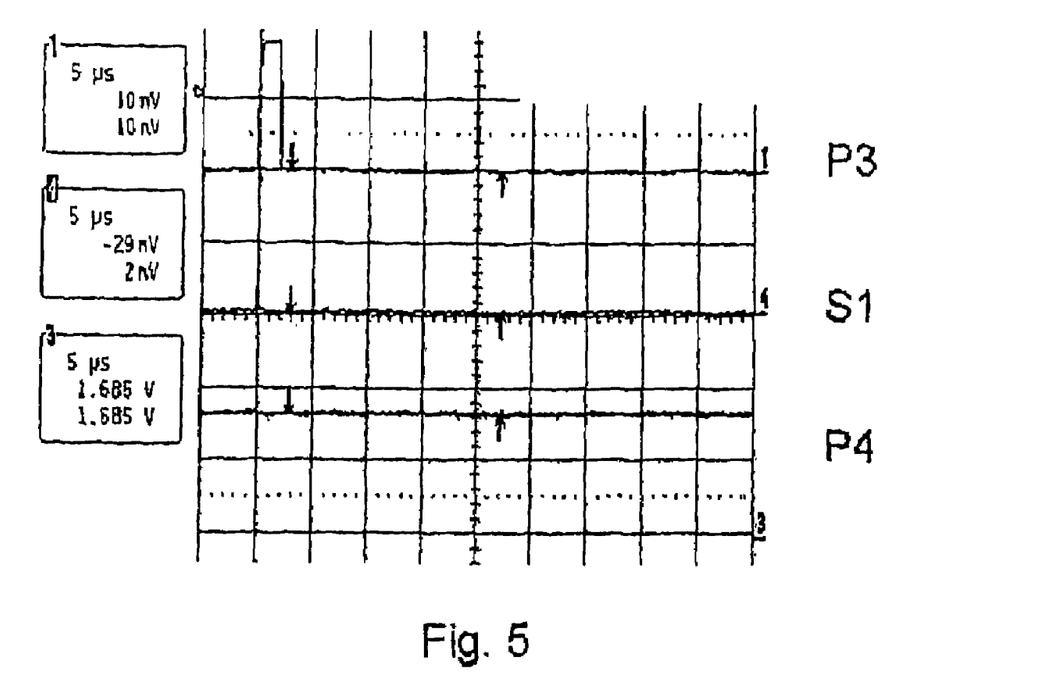
FIG. 5 shows the voltage signal tapped at the coil terminal S1 with a short-circuited coil.
Figure 6:
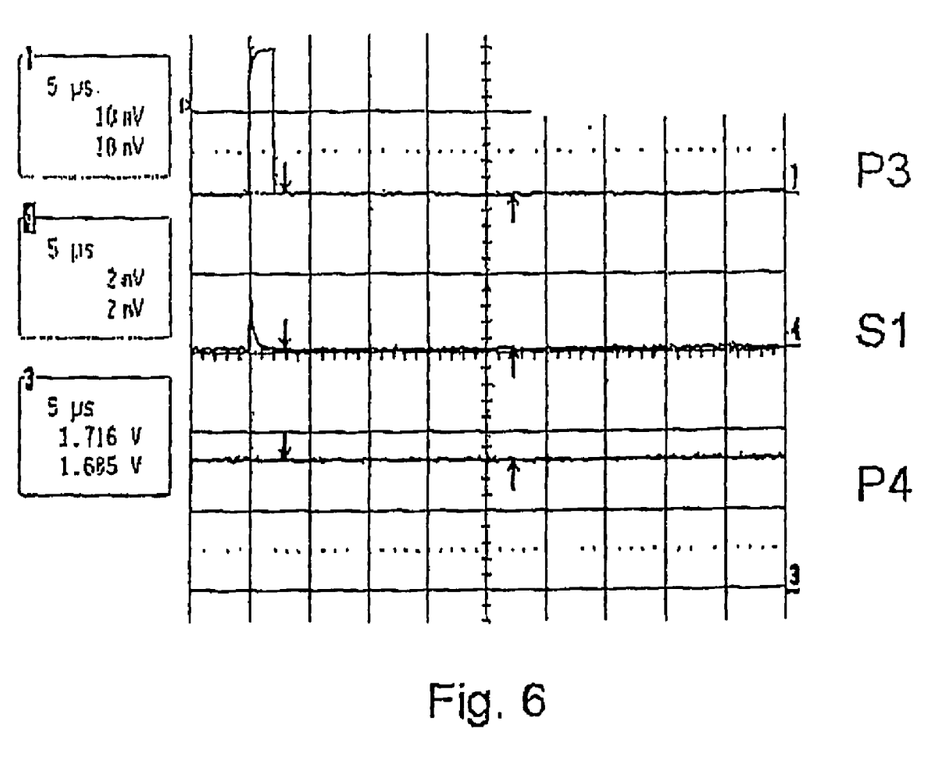
FIG. 6 shows the voltage signal tapped at the coil terminal S1 when the coil is replaced with a resistance.

With the aid of FIGS. 4, 5 and 6 the behaviour of the detection circuit after an excitation pulse is represented for the case in which no coil L is connected to the coil terminals S1 and S2.

in FIG. 4 the behaviour is represented when the coil L has been removed with a high ohmic resistance from the coil terminals S1 and S2, between which therefore no conduction takes place. Since the system is now no longer capable of oscillation, no negative voltage any longer occurs at the coil terminal S1. Therefore the NPN transistor V4 is no longer conducting and the input port P4 remains as a result of the pull-up resistance R2 at a positive voltage potential as a function of the operating voltage Ub.

FIGS. 5 and 6 show the corresponding behaviour with short-circuited coil terminals S1 and S2. In the voltage characteristic represented in FIG. 5 the coil terminals S1 and S2 have been short-circuited with a very low resistance; in contrast in the case of the voltage characteristic according to FIG. 6 they are short-circuited with a 75-ohm resistance. In both cases, the voltage present at the input port P4 corresponds to the voltage level prescribed by the operating voltage Ub. No negative voltage occurs at the coil terminal S1 and also therefore no negative flank occurs on the voltage signal present at the input port P4.

Therefore, the proposal according to the present technology for the detection of a coil L in an electronic circle is also very robust in the cases in which the coil L has been replaced by an ohmic resistance between the coil terminals S1 and S2.

REFERENCE SYMBOL LIST

D1 microprocessor
L receiver coil
S1, S2 first and second coil terminals of the receiver coil
LS transmitter coil
C1 to C3 condensers
V1 to V3 diodes
V4 NPN transistor
V5 MOSFET transistor
V6 Schottky diode
V7 diode
V8 voltage regulator
V9 Schottky diode
Ub operating voltage
PS programming interface
P1 to P5 input ports, output ports of the microprocessor
Pi output port for initialisation of a downstream function
R1, R2 resistances

The invention claimed is:

1. A method for the detection of a coil (L) in an electronic circuit, which is operated with a direct voltage (Ub) lying in a prescribed voltage range, and in which the coil (L) together with a condenser (C1) forms an electrical oscillating circuit, comprising the step where the electrical oscillating circuit is excited with a pulse which during the oscillation temporarily generates a voltage value lying outside the prescribed voltage range at a first coil terminal (S1) that can be tapped on the coil (L), and wherein the generated voltage value lying outside the prescribed voltage range is determined by sampling a flank of the voltage signal.

2. The method according to claim 1, wherein the voltage polarity tapped at the first coil terminal (Si) is registered at an input port (P4) of a microprocessor (D1).

3. The method according to claim 2, wherein the tapping of the voltage at the first coil terminal (S1) takes place by means of electrical components (V4) that are part of a rectifier circuit (V1, V2, V3, V4).

4. The method according to claim 3 wherein the removal of a coil (L) from an electronic circuit is ascertained.

5. The method according to claim 2, wherein the voltage present at the first coil terminal (S1) is tapped via an NPN transistor (V4).

6. The method according to claim 2, wherein the voltage present at the first coil terminal (S1)is drawn on for the determination of the frequency of an alternating voltage externally applied to the coil (L).

7. The method according to claim 2 wherein the removal of a coil (L) from an electronic circuit is ascertained.

8. The method according to claim 1, wherein the tapping of the voltage at the first coil terminal (S1) takes place by means of electrical components (V4) that are part of a rectifier circuit (V1, V2, V3, V4).

9. The method according to claim 8, wherein the voltage present at the first coil terminal (S1) is tapped via an NPN transistor (V4).

10. The method according to claim 8, wherein the voltage present at the first coil terminal (S1) is drawn on for the determination of the frequency of an alternating voltage externally applied to the coil (L).

11. The method according to claim 1, wherein the tapping of the voltage at the first coil terminal (S1) takes place by means of electrical components (V4) that are part of a rectifier circuit (V1, V2, V3, V4).

12. The method according to claim 11, wherein the voltage present at the first coil terminal (S1) is drawn on for the determination of the frequency of an alternating voltage externally applied to the coil (L).

13. The method according to claim 1, wherein the voltage present at the first coil terminal (S1) is tapped via an NPN transistor (V4).

14. The method according to claim 1, wherein the voltage present at the first coil terminal (S1) is drawn on for the determination of the frequency of an alternating voltage externally applied to the coil (L).

15. The method according to claims 1, 8, or 11 wherein the removal of a coil (L) from an electronic circuit is ascertained.

16. An arrangement for the detection of a coil (L) in an electronic circuit operated with a direct voltage (Ub) in a prescribed voltage range, with a coil (L) and a condenser (C1), which form an electrical oscillating circuit, comprising a first coil terminal (S1) of the coil (L) connected to a pulse generator (P3, D1) for the generation of a pulse and has a voltage detector (P4, D1) for the detection of a voltage value lying outside the voltage range of the direct voltage (Ub), and wherein the voltage value lying outside the prescribed voltage range is determined by sampling a flank of the voltage signal.

17. The arrangement according to claim 16, wherein the voltage detector (P4, D1) is connected via an NPN transistor (V4) to the first coil terminal (Si).

18. The arrangement according to claim 17, wherein a Schottky diode (V9) is connected to the ground between the NPN transistor (V4) and the voltage detector (P4, D1).

19. The arrangement according to claim 18, wherein a rectifier (V1, V2, V3, V4) is connected downstream of the electrical oscillating circuit.

20. The arrangement according to claim 17, wherein a rectifier (V1, V2, V3, V4) is connected downstream of the electrical oscillating circuit.

21. The arrangement according to claims 16, 17, or 18, wherein the voltage detector and the pulse generator are input and output ports (P4, P3) respectively of a microprocessor (D1).

22. The arrangement according to claim 21, wherein a rectifier (V1, V2, V3, V4) is connected downstream of the electrical oscillating circuit.

23. The arrangement according to claim 16, wherein a rectifier (V1, V2, V3, V4) is connected downstream of the electrical oscillating circuit.

24. The arrangement according to claims 23, 20, or 19, wherein the NPN transistor (V4) is part of the rectifier (V1, V2, V3, V4).

25. The arrangement according to claim 24, wherein the NPN transistor (V4) is operated inversely to increase its maximum voltage.

26. A method for the ascertainment of the removal of a coil, wherein the coil (L) is initially present in an electronic circuit operated with a direct voltage (Ub) in a prescribed voltage range, with the coil (L) and a condenser (C1), which form an electrical oscillating circuit, comprising connecting a first coil terminal (S1) of the coil (L) to a pulse generator (P3, D1) for the generation of a pulse and using a voltage detector (P4, D1) for the detection of a voltage value lying outside the voltage range of the direct voltage (Ub), and wherein the voltage value lying outside the prescribed voltage range is determined by sampling a flank of the voltage signal.

27. The method according to claim 26, wherein the voltage detector (P4, D1) is connected via an NPN transistor (V4) to the first coil terminal (Si).

28. The method according to claim 27, wherein a Schottky diode (V9) is connected to the ground between the NPN transistor (V4) and the voltage detector (P4, D1).

29. The method according to claim 28, wherein a rectifier (V1, V2, V3, V4) is connected downstream of the electrical oscillating circuit.

30. The method according to claim 27, wherein a rectifier (V1, V2, V3, V4) is connected downstream of the electrical oscillating circuit.

31. The method according to claims 26, 27, or 28, wherein the voltage detector and the pulse generator are input and output ports (P4, P3) respectively of a microprocessor (D1).

32. The method according to claim 31, wherein a rectifier (V1, V2, V3, V4) is connected downstream of the electrical oscillating circuit.

33. The method according to claim 26, wherein a rectifier (V1, V2, V3, V4) is connected downstream of the electrical oscillating circuit.

34. The method according to claims 33, 30, or 29, wherein the NPN transistor (V4) is part of the rectifier (V1, V2, V3, V4).

35. The method according to claim 34, wherein the NPN transistor (V4) is operated inversely to increase its maximum collector voltage.

* * * * *